US006301688B1

United States Patent
Roy (10) Patent No.: US 6,301,688 B1
(45) Date of Patent: Oct. 9, 2001

(54) INSERTION OF TEST POINTS IN RTL DESIGNS

(75) Inventor: Subrata Roy, Mercer, NJ (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/199,018

(22) Filed: Nov. 24, 1998

(51) Int. Cl.[7] .................................................. G06F 17/50
(52) U.S. Cl. ........................................ 716/4; 716/2; 716/3
(58) Field of Search ..................................... 716/4, 12, 18

(56) References Cited

U.S. PATENT DOCUMENTS

| | | | |
|---|---|---|---|
| 5,450,414 | * | 9/1995 | Lin ........................................ 371/22.3 |
| 5,604,895 | * | 2/1997 | Raimi .................................... 395/500 |
| 5,703,789 | * | 12/1997 | Beausang et al. ..................... 364/489 |
| 5,737,340 | * | 4/1998 | Tamarapalli et al. ................. 371/22.5 |
| 5,828,828 | * | 10/1998 | Lin et al. ........................... 395/183.06 |
| 5,883,809 | * | 3/1999 | Sullivan et al. ....................... 364/489 |
| 6,038,691 | * | 3/2000 | Nakao et al. .......................... 714/733 |
| 6,070,261 | * | 5/2000 | Tamarapalli et al. ................. 714/733 |

OTHER PUBLICATIONS

Journal of Electronic Testing: Theory and Applications, 7 125–137 (1995), Kluwer Academic PublisBoston, Integration of Partial Scan and Built–In Self–Test, Chih–Jen Iin et al.

Tsai et al., Efficient Test–Point Selection for Scan–Based BIST, IEEE Transactions on Very Large Scale Integration, pp. 667–676, Dec. 1998.*

B. Seiss et al., Test Point Insertion for Scan–Based BIST, Proc. of 2nd European Test Conference, pp. 253–262, Apr. 1991.*

Chen et al., Behavioral Synthesis for Testability, IEEE/ACM International Conference on Computer–Aided Design, pp. 612–615, Nov. 1992.*

Schotten et al., Test Point Insertion for an Area Efficient BIST, Proceedings of International Test Conference, pp. 515–523, Oct. 1995.*

Gu et al., Testability Analysis and Improvement from VHDL Specifications, Proc. Euro–DAC, pp. 644–649, Sep. 1994.*

Parikh et al., A Cost–Based Approach to Partial Scan, Proceedings of the 30th International Conference on Design Automation, pp. 255–259, Jun. 1993.*

(List continued on next page.)

Primary Examiner—Caridad Everhart
Assistant Examiner—A. M. Thompson
(74) Attorney, Agent, or Firm—Synnestvedt & Lechner LLP (57) ABSTRACT

A method is disclosed for inserting test points in RTL VHDL designs or other high level circuit designs such that after a synthesis process the resulting gate-level design contains test points which improves fault coverage in a Full Scan BIST environment.

15 Claims, 5 Drawing Sheets

OTHER PUBLICATIONS

Chen et al., Structural and Behavioral Synthesis for Testability Techniques, IEEE Transactions on Computer–Aided Design of Integrated Circuits and Systems, pp. 777–785, Jun. 1994.*

Carletta et al., Testability Analysis and Insertion for RTL Circuits based on Pseudorandom BIST, pp. 162–167, Oct. 1995.*

Boubezari et al., Testability Analysis and Test–Point Insertion in RTL VHDL Specifications for Scan–Based BIST, IEEE Transactions on Computer–Aided Design of Integrated Circuits and Systems, pp. 1327–1340, Oct. 1999.*

Lisanke et al., Testability–Driven Random Test–Pattern Generation, IEEE Transactions on Computer–Aided Design, pp. 1082–1087, Nov. 1987.*

Brglez et al., Synergy of Synthesis and Test, Proceedings of 8th University/Government/Industry/Microelectronics Symposium, pp. 240–245, Jun. 1989.*

Dey et al., Considering Testability During High–Level Design, Proceedings ASP–DAC 1998, pp. 205–210, Feb. 1998.*

Cheng et al., Timing–Driven Test Point Insertion for Full–scan and Partial–Scan BIST, International Test Conference, pp. 506–514, Oct. 1995.*

Nakao et al., Accelerated Test Points Selection method for Scan–Based BIST, Proceedings Test Symposium, pp. 359–364, Nov. 1997.*

Tamarapalli et al., Constructive Multi–Phase Test Point Insertion for Scan–Based BIST, International Test Conference, pp. 649–658, Jun. 1996.*

Gu et al., A Controller Testability Analysis and Enhancement Technique, Proceedings of European Design and Test Conference, pp. 153–157, Mar. 1997.*

* cited by examiner

```
1. process(y, x, init)
2. begin
3.   next_y <= y;
4.   next_g <= gin;
5.   if (init = '1')
6.   then
7.     next_y <= yi;
8.   else if (x = y) then
9.     next_g <= x;
10.  else if(x < y) then
11.    next_y <= y - x;
12.  end if;
13. end process;
```

Assumption: a, b are independent          Rule No.

$Z = a+b$     $C(z) = C(a) + C(b) - C(a)C(b)$     C1
              $O(a) = (1-C(b))O(z)$                O1
              $O(b) = (1-C(a))O(z)$ $z = a \cdot b$   $C(z) = C(a)C(b)$              C2
                  $O(a) = C(b)O(z)$              O2
                  $O(b) = C(a)O(z)$ $z = a'$      $C(z) = (1-c(a))$                  C3
              $O(a) = O(z)$                      O3

```
entity design is                                    --1
    port( ....                                      --2
        or_cp : std_logic_vector(0 to 2);           --3
        Obs : std_logic_vector(0 to 1));            --4
end design;                                         --5 architecture RTL of design is                       --6
signal init_ocp : std_logic;
begin
process(y, x, init_ocp, xeqy : std_logic;
begin                                               --11
xlty := toStdlogic(x <y);                           --12
xlty_ocp := xlty or or_cp(1);                       --13
obs(0) <= xlty;                                     --14
equal_tp(x, y, 7, or_cp(3), xeqy, obs(1));          --15 next_y <=y;
next_g <= gin;
if (init_ocp = '1') then
  next_y <= yi;
else if(xeqy = '1') then
  next_g <= x;
else if(xlty_ocp = '1') then
  next_y <= y - x;
end if;
end process;
init_ocp <= init or or_cp(0);                       --26
end
```

INSERTION OF TEST POINTS IN RTL DESIGNS

FIELD OF THE INVENTION

The present invention relates generally to the design of integrated circuits and other complex electronic circuits, and more particularly to circuit design processes which make use of automated computer-implemented design techniques.

BACKGROUND OF THE INVENTION

Application-specific integrated circuits (ASICs) and other types of complex electronic circuits are often designed using Register Transfer Level (RTL) techniques. In an RTL-based design process, the design is initially expressed in a high level Hardware Description Language (HDL) such as VHSIC (Very High Speed Integrated Circuit) Hardware Description Language (VHDL), which is a standard of the Institute of Electrical and Electronics Engineers (IEEE). At the HDL level, the "behavior" of the design (e.g., inputs, outputs, functionality, etc.) is entered into a computer and then the design, as expressed in the HDL, is converted to a gate-level description (a "netlist") using a process referred to as synthesis. The synthesis process optimizes the gate-level description within the area and timing constraints of the particular design in a well known manner.

ASICs and other complex circuits may also make use of Design for Test (DFT) techniques which modify the design to ensure that the final gate-level design is testable for internal faults such as "stuck-at-one" or "stuck-at-zero" conditions on signal lines. A gate-level design is generally considered testable if it is possible to obtain a sufficiently high fault coverage by using test vectors generated by an automatic test pattern generator program or by on-chip logic configured to provide a function referred to as Built-In Self Test (BIST). BIST eliminates the need for off-chip test pattern generation and allows at-speed testing by embedding test pattern generation and signature computation hardware within the design.

Scan based BIST is widely used in gate level circuits, and utilizes scan chains to apply random vectors and observe signal values within the random logic at every flip-flop in a well known manner. Random pattern resistant faults are addressed by inserting carefully chosen test points after the circuit has been synthesized to the gate level.

Figure 1A:
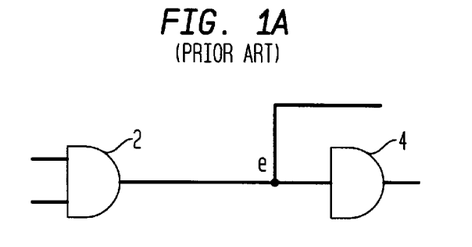
FIGS. 1A and 1B illustrate gate-level insertion of an observation point according to the prior art.
Figure 1B:
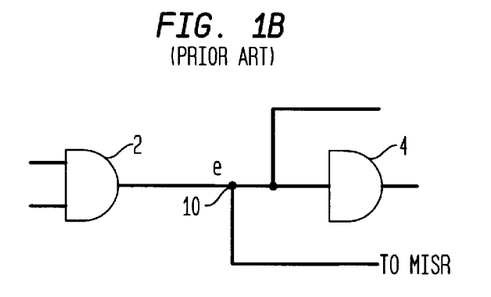
Figure 2A:
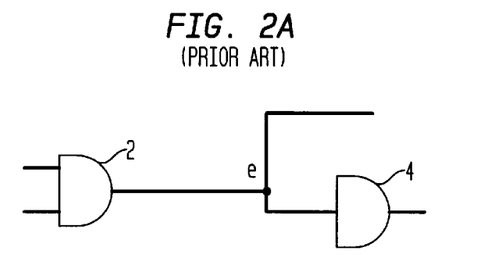
FIGS. 2A and 2B illustrate gate-level insertion of a control point in accordance with the prior art.
Figure 2B:
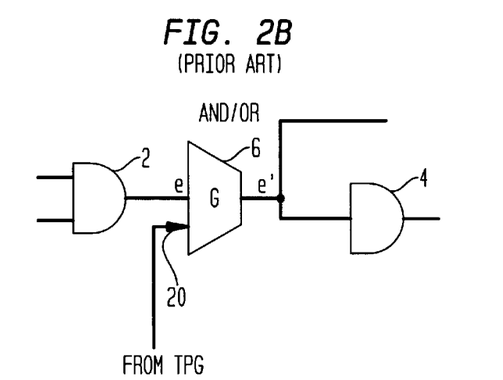

FIGS. 1A, 1B, 2A, and 2B illustrate a prior art method for insertion of test point in gate level design comprising AND gates 2 and 4. FIGS. 1A and 2A show gate level circuits which do not include test points. Two types of test points, an observation point 10 (FIG. 1B) and a control point 20 (FIG. 2B), can be inserted in the gate level design to improve BIST fault coverage. This method is described in detail in "Integration of Partial Scan and Built-in Self Test" by C. J. Lin, Y. Zorian, and S. Bhawmik (Journal of Electronic Testing, Vol. 7, 125–137, 1995), incorporated herein by reference. In FIG. 1B, the observation point 10 is connected so that the output of the node can be observed by a Multiple Input Shift Register (MISR) in a known manner. In FIG. 2B, a control point 20 is inserted into a node and is coupled to a Test Pattern Generator (TPG) which, in a known manner, allows improved controllability of the node e'. In the example shown in FIG. 2B, a generic symbol 6 illustrates an AND or an OR gate corresponding to either an AND-control point or an OR-control point.

To avoid expensive fault simulation of the complete circuit, test point insertion is typically based on probabilistic testability measures known as controllability/observability procedures (COPs). COPs are well known for estimating the controllability and observability of every signal in a gate level combinational network. Controllability ($C_s$) is the probability that the signal s will have value 1. Observability ($O_s$) is the probability of observing the value of the signal s at any observation point such as a primary output or a scan flip-flop. The global impact of controllability and observability can be estimated in a well-known manner by calculating the cost function U (the average number of pseudo-random patterns required to detect a fault over the complete fault set) according to Equation (1):

$$U = \frac{1}{|F|}\left(\sum_{i \in F} \frac{1}{Pd_i}\right) \tag{1}$$

where F is the Fault Set, |F| is the cardinality of F, and $Pd_i$ is the detection probability of fault i. For the stuck-at-fault model, $Pd_i$ can be computed from controllability ($C_s$) and observability ($O_s$) using Equations (2a) and (2b) as follows:

$$Pd_{s/0} = C_s \cdot O_s, \text{ for stuck-at-0 fault at } s \tag{2a}$$

$$Pd_{s/1} = (1-C_s) \cdot O_s, \text{ for stuck-at-1 fault at } s \tag{2b}$$

$1/Pd_i$ is as the expected number of pseudo-random patterns required to detect the fault i. The effectiveness of a test point can be measured by Actual Cost Reduction (ACR), which is the amount by which U is reduced after inserting the test point. The controllability and observability values can also be used to estimate the fault coverage given a fixed number l of parallel pseudo-random patterns applied to the primary inputs and all flip-flops. The probability of detecting the fault i within the l patterns is given by Equation (3):

$$fc_i(l) = (1-(1-Pd_i)^l) \tag{3}$$

The Fault coverage estimate is given by equation (4):

$$FC(l) = \frac{1}{|F|}\sum_{i \in F} fc_i(l) \tag{4}$$

Test points can be selected by computing ACR for each candidate test point and selecting the test point which maximizes ACR. Optimally, several such test points are iteratively selected until the fault coverage estimate reaches a desired value.

It has been shown in commonly assigned patent application Ser. No. 09/390,983 (entitled "Register Transfer Level (RTL) Based on Scan Insertion For Integrated Circuit Design") that the scan chain of a scan based BIST can be inserted as RTL-VHDL code within the core logic. However, nothing in the prior art teaches the insertion of test points as RTL code at the pre-synthesis level. While insertion of the scan chain as RTL code is an improvement over gate-level insertion of scan chains, it cannot achieve an optimal level of fault coverage.

SUMMARY OF THE INVENTION

The present invention provides techniques for inserting test points in RTL VHDL designs or other high level circuit designs such that after a synthesis process the resulting gate-level design contains test points which improves fault coverage in a Full Scan BIST environment.

The above technique is accomplished by a method for inserting a set of test points (which can comprise one or more test points) in an RTL VHDL design in which an RTL source file is synthesized into a gate-level description, comprising the steps of (1) converting the RTL source file to an RTL netlist model which includes synthesizable operators; (2) defining a functional testability model for each synthesizable operator; (3) converting the defined functional testability models to controllability/observability equations; (4) creating a list of candidate test points based on the controllability/observability equations; (5) selecting from the list of candidate test points the test point(s) which will achieve a target fault coverage; and (6) inserting the test point(s) in the RTL source file prior to synthesis into the gate-level description. By repeating the selection and insertion steps additional test points can be added to the set to improve fault coverage.

DETAILED DESCRIPTION OF THE PREFERRED EMBODIMENT

The present invention enables the insertion of test points at the pre-synthesis level. The present invention involves four basic steps. First, the basic RTL-VHDL source code which will define the gate level circuit must be converted to a structural netlist; then, testability measures must be computed for the RTL operators found in the structural netlist; next, test points must be selected for insertion in the core code based on the testability measures; and finally, the test points are inserted in the RTL-VHDL test code.

The following description illustrates the present invention using an exemplary Register Transfer Level (RTL) design process as applied to exemplary integrated circuits. It should be understood, however, that the invention is not limited to use with any particular type of circuit or design process. For example, although particularly well-suited for use in Built-In Self Test (BIST) applications, the techniques may also be applied to the design of circuits which use externally driven scan test techniques. The term "design-level description" as used herein refers to a description of a circuit or other device in a high level design language such as RTL VHDL. This term is intended to include not only RTL VHDL but also other high level design languages suitable for use in complex circuit design applications. The term "scan chain" is intended to include a set of flip-flops or other logic circuit elements configured to permit testing of a combinational logic or other circuitry. For example, scan chains may be connected in a manner that allows shifting in of test vectors which can be applied to combinational logic between the scan chains. The term "process" as used herein is intended to include not only VHDL processes but also other types of constructs in other design languages.

In order to facilitate the computation of the testability measures used in gate level design (Controllability and Observability) in an RTL-VDHL entity/architecture, it is necessary to convert the RTL-VHDL source code to a structural netlist called the RTL Netlist Model. An RTL netlist model is a generalization of a gate level netlist, where gates are replaced by higher level RTL operators connected by nets that can carry signals of complex VHDL date types such as arrays or records. In gate level circuits, nets are wires that connect input and output ports of different gates and can only carry 1 bit (0 or 1) values. In an RTL netlist, nets can also carry complex data types (e.g. 16-bit values or integers).

The RTL-operators are VHDL functions and are directly synthesizable by the synthesis tool. Unlike primitive gates, these operators take multi-bit words as their input and perform operations such as arithmetic addition on fixed-width integers. Their meanings are defined by VHDL libraries standardized by IEEE or provided by the synthesis vendor.

A control construct operator (e.g., ca_op: conditional assignment) models the control flow of a VHDL code set and represents control constructs such as conditional branches (e.g., "if" or "case"). The operator ca_op is of the form ca_op(c0, d0, ... c$<$i$>$, d$<$i$>$, ... dn)(dout), where c$<$i$>$ are boolean conditions and d$<$i$>$ are data that are conditionally assigned to dout. This operator sets the value of dout as follows:

if(c$<$0$>$) then dout $<$=d$<$0$>$; ...

else if(c$<$i$>$) then dout $<$=d$<$I$>$. . .

else dout $<$=dn;

end if;

No operator is required for loops since synthesizable RTL- VHDL only allows loops with a fixed number of iterations which are unfolded during elaboration. Similar unfolding needs to be done while converting an RTL-VHDL to an RTL Netlist Model.

Figure 3A:
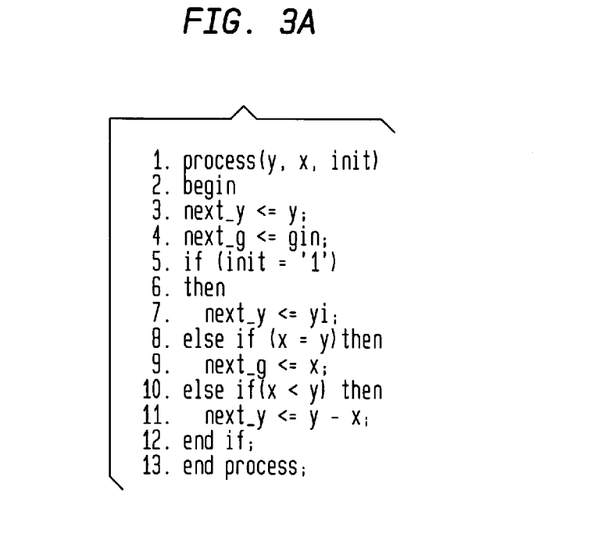
FIG. 3A illustrates a VHDL construct.
Figure 3B:
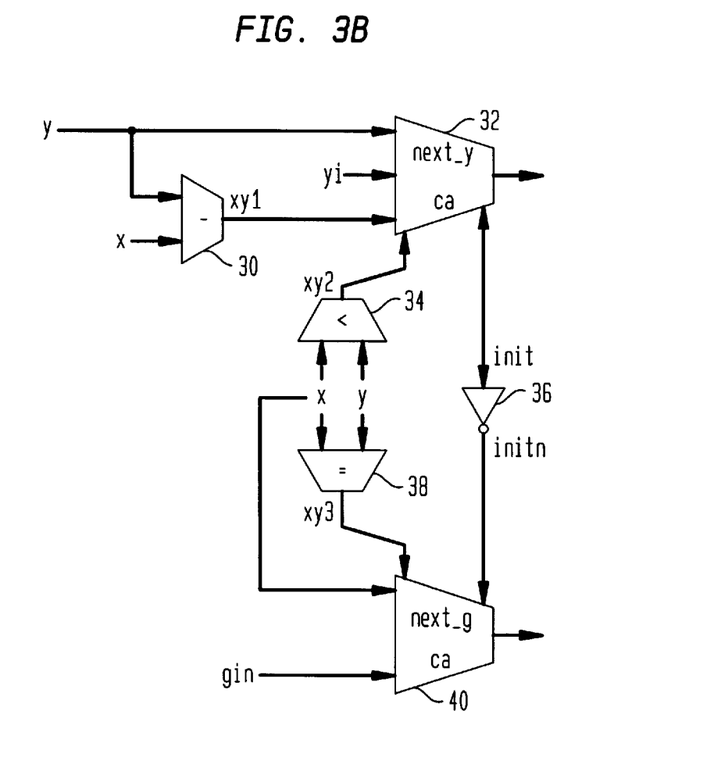
FIG. 3B illustrates an RTL netlist corresponding to the VHDL construct of FIG. 3A.

FIG. 3 shows an example of a VHDL construct (FIG. 3A) and the corresponding RTL netlist (FIG. 3B) for a portion of a program which performs a computation of the greatest common division of two 16-bit integers. The conversion from the VHDL construct of FIG. 3A to the RTL netlist of FIG. 3B is performed in a known manner and does not, in and of itself, constitute the invention herein. As can be seen in this example, some new intermediate data objects (e.g., xy1 and xy2) representing results of an expression are created during the conversion process and thus appear in the RTL netlist of FIG. 3B but not in the VDHL construct of FIG. 3A.

The correspondence between FIG. 3A and FIG. 3B is generally as follows:

| | |
|---|---|
| Substraction Operator 30 | Performs the substraction function of line 11 of FIG. 3A. |
| Control Operator 32 | Combines the values assigned to the variables of lines 1, 3, 7 and 11 of FIG. 3A. |
| Inverter 36 | Performs the implied inversion (the "else" steps of lines 8 and 10 of FIG. 3A. |

-continued

| | |
|---|---|
| "Less than" Operator 34 | Performs the "less than" function of line 10 of FIG. 3A. |
| "Equals" Operator 38 | Performs the "Equals" operation of line 8 of FIG. 3A. |
| Control Operator 40 | Combines the values assigned to the variables of steps 4 and 9 of FIG. 3A. |

Each RTL operator is defined as a C++ class derived from the base class RTL_op. The functions are defined by writing software code so that a program for calculating testability measures (described in more detail below) will call the correct functions for the specific operator. When invoked from an instance of an RTL_op, the function corresponding to the specific operator type is called. In order to compute the testability measures for the RTL Netlist, according to the present invention the following functions for each type of RTL operator must be defined as virtual member functions of the class RTL_op:
1. "RTL_op::compute_ctl(Boolean with_tp" Given the controllability value for all the inputs to this operator, compute the controllability of the outputs. If "with_tp" is True, then consider the impact of any test points within this operator.
2. "RTL_op::compute_obs(Boolean with_tp)" Given the observability values for all the outputs of this operator compute the observability of all its inputs. If "with-tp" is True, consider the impact of any test points within this operator.
3. "Int RTL_op::fault_size( )" Compute the estimated number of faults within this operator.
4. "Float RTL_op::sum_pat_len( )" Given the observability of all the outputs and controllability of all the inputs, compute the sum $1/(pd_{i})$ where $Pd_i$ is defined by equations 2a, and 2b, and where F is the fault set within this operator.
5. "Float RTL_op::fault_cov_est(int plen)" "Given the observability of all the outputs and controllability of all the inputs, compute the sum $$\sum_{i \in F} fc_{i)(L)}$$

where $fc_i$ (l) is defined by equation 3 and F is the fault set within this operator.

Figure 4:
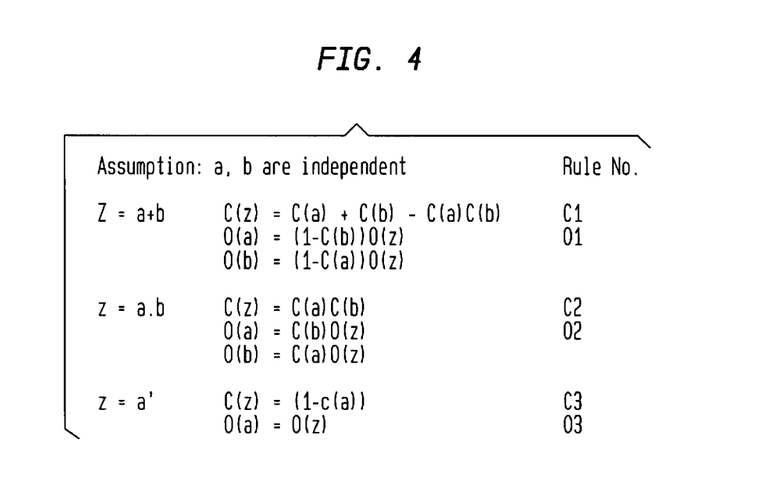
FIG. 4 illustrates rules for simple boolean operators.

The functions "compute_ctl" and "compute_obs" are written based on a structural model of the operator detailed enough to expose the boolean relationship between the input and output bits. RTL operators generally have inputs/outputs which carry complex data (e.g., 16-bit vectors). A structural model which exposes the boolean relationship contains components whose input/outputs carry only 1-bit (boolean) values. These boolean equations can be converted to controllability/observability equations. The conversion uses the rules for simple boolean operators as shown in FIG. 4. These rules may need to be modified to take into account dependencies between internal signals (an example of such a modification is given below with respect to Equation 6a). The remaining functions require a more detailed structural model using a fixed set of boolean gates as primitive components (e.g., and/or/and/nor/not) which expose the gate level fault sites within the operator.

Figure 5:
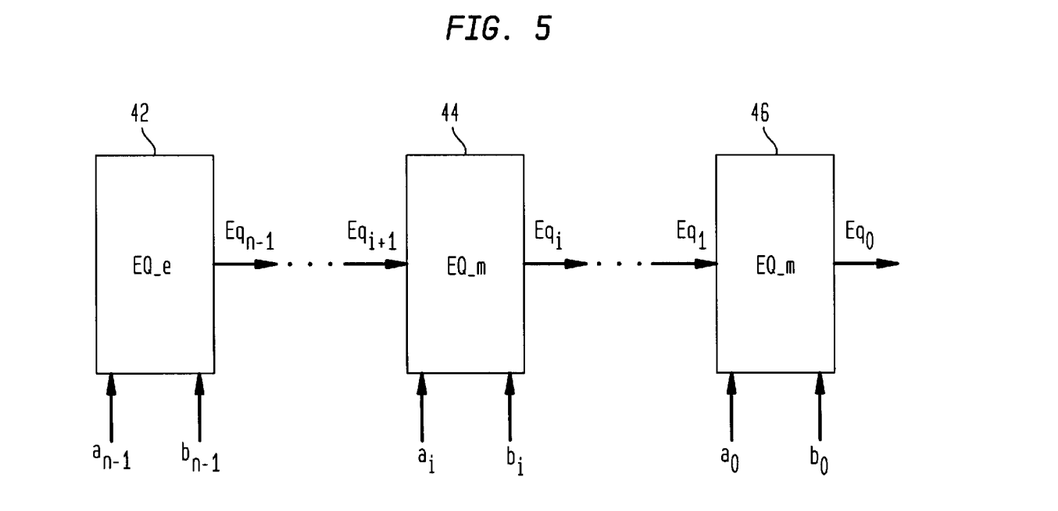
FIG. 5 illustrates a testability model developed in accordance with the method of the present invention where the boolean relationships are exposed.

An example of a testability model using the above-described functions is described with reference to FIG. 5.

The operator "=" requires operator test points for high fault coverage and compares 2 bit vectors of fixed width and generates a "1" if they are equal. Otherwise the output is "0". The width(n) is specified in the declaration of the inputs. This testability model. exposes the boolean relationship between the input and output bits. The model consists of an iterative array of logic blocks 42, 44, and 46, each processing a pair of bits from the input vectors. In the following description, $(a_{n-1} \ldots a_0)$ and $(b_{n-1} \ldots b_0)$ represent the 2 n-bit input vectors and $a_i$ and $b_i$ are 1-bit signals. The boolean equations for the outputs $Eq_i$ are:

$$Eq_{n-1} = a_{n-1} \cdot b_{n-1} + a_{n-1}' \cdot b_{n-1}' \quad (5a)$$

$$Eq_i = Eq_{i+1} \cdot (a_i \cdot b_i + a_i' \cdot b_i') \quad (5b)$$

$Eq_0$ is the 1-bit output of the operator. The equations for computing the controllability C and observability O for a specific 1-bit signal, derived from the boolean equations 5a and 5b, are as follows:

$$C(Eq_{n-1}) = C(a_{n-1})C(b_{n-1}) + (1-C(a_{n-1}))(1-C(b_{n-1})) \quad (6a)$$

$$C(Eq_i) = C(Eq_{i+1}) \cdot (C(a_i)C(b_i) + (1-C(a_i))(1-C(b_i))) \quad (6b)$$

$$O(a_i) = C(Eq_{i+1})O(Eq_i) \quad (6c)$$

$$O(b_i) = C(Eq_{i+1})O(Eq_i) \quad (6d)$$

$$O(Eq_{i+1}) = (C(a_i)C(b_i) + (1-C(a_i))(1-C(b_i))) \, O(Eq_i) \quad (6e)$$

$$O(a_{n-1}) = O(Eq_{n-1}) \quad (6f)$$

$$O(b_{n-1}) = O(Eq_{n-1}) \quad (6g)$$

where the terms within the parenthesis represent a specific signal.

Equation 6a is derived from Equations 5a by using (from FIG. 4) rule C2 and the modified form of rule C1 where C(a)C(b) is removed (since a(=ai·bi) and b(=ai'·bi') are mutually exclusive). The equations 6a and 6b allow computation of the controllability of the outputs $Eq_i$, given the controllability of $a_i$, $b_i$. Equations 6c through 6g allow computation of the observability of $a_i$ and $b_i$, given the observability of $Eq_0$. The output controllability (Eq0) and input observability ($a_i$, $b_i$) values computed by these equations are independent of the structural model used to develop these equations, provided all dependencies between the internal signals are taken into account while developing these equations.

Figure 6:
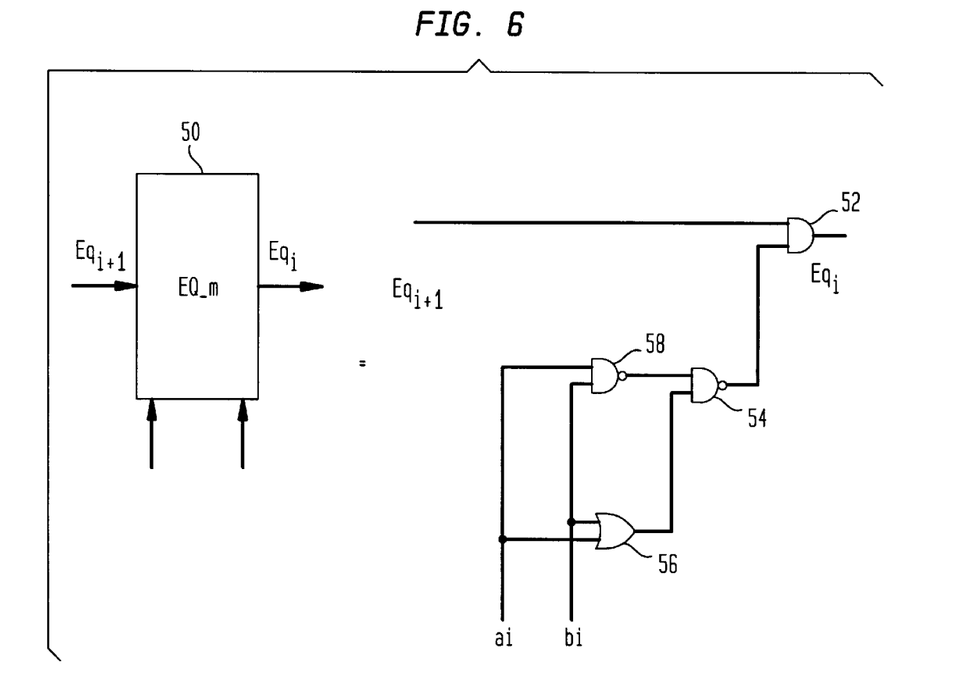
FIG. 6 illustrates a detailed model for an exemplary function (Eq_m) where the fault sites are exposed.

The remaining functions "fault_size", "sum_pat_len" and "fault_cov_est", require more detailed structural models based on primitive gates to expose all the fault sites. The detailed model for a logic block 50 is shown in FIG. 6. 1-bit signals $a_i$ and $b_i$ are input to a logic block comprising NAND gate 58, OR gate 56 and NAND gate 54. The output of this logic block is ANDed with output $Eq_{i+1}$ at AND gate 52. Given the controllability and observability values for $Eq_i$, $Eq_{i+1}$, $a_i$ and $b_i$, as computed from the model in FIG. 5, the values for all the internal fault sites can be computed by using the rules of FIG. 4. Using the $Pd_i$ values for all faults in the gate level model, the functions "sum_pat_len" and "fault_cov_est" can be computed for the operator "=". Unlike compute_ctl" and "compute_obs" functions, these functions are dependent on the implementation architecture. To minimize this error, these functions may be based on the implementation architectures supported by the synthesis tool being used.

Once the structural netlist is created, the testability measures for the RTL apparatus must be computed. The following steps describe an algorithm which computes testability measures in accordance with the present invention. For the purpose of explanation, the algorithm is called "TestMeasures". Given an RTL entity/architecture, the goal is to compute the testability measures U and FC(l) for a given pattern length l. First, the RTL entity/architecture is converted to an RTL Netlist Model called "rtl_mod". Next, the controllability of the primary inputs PI (the internal inputs of the IC) and registered data RD (single or multi-bit signals in RTL-VHDL) is initialized (e.g., to 0.5). Then, the observability of the primary outputs PO (the external outputs of the IC) and registered data RD is initialized to 1. Following the initialization of the observability, the controllability of all nodes in rtl_mod is computed by tracing the netlist from PI/RD to PO/RD using the RTL operator function "RTL_op::compute_ctl( )" for each operator instance. Next, the observability for all nodes in rtl_mod is computed by tracing from PO/RD to PI/RD using the function "RTL_op::compute_obs( )." After that, the Fault Coverage Estimate FC(l) is computed using the functions "fault_size" and "fault_cov_est" for each operator instance in $rtl_{13}$ mod. Finally, the testability measure U is computed, using the functions "fault_size" and "sum_pat_len" for each operator instance.

Figure 7:
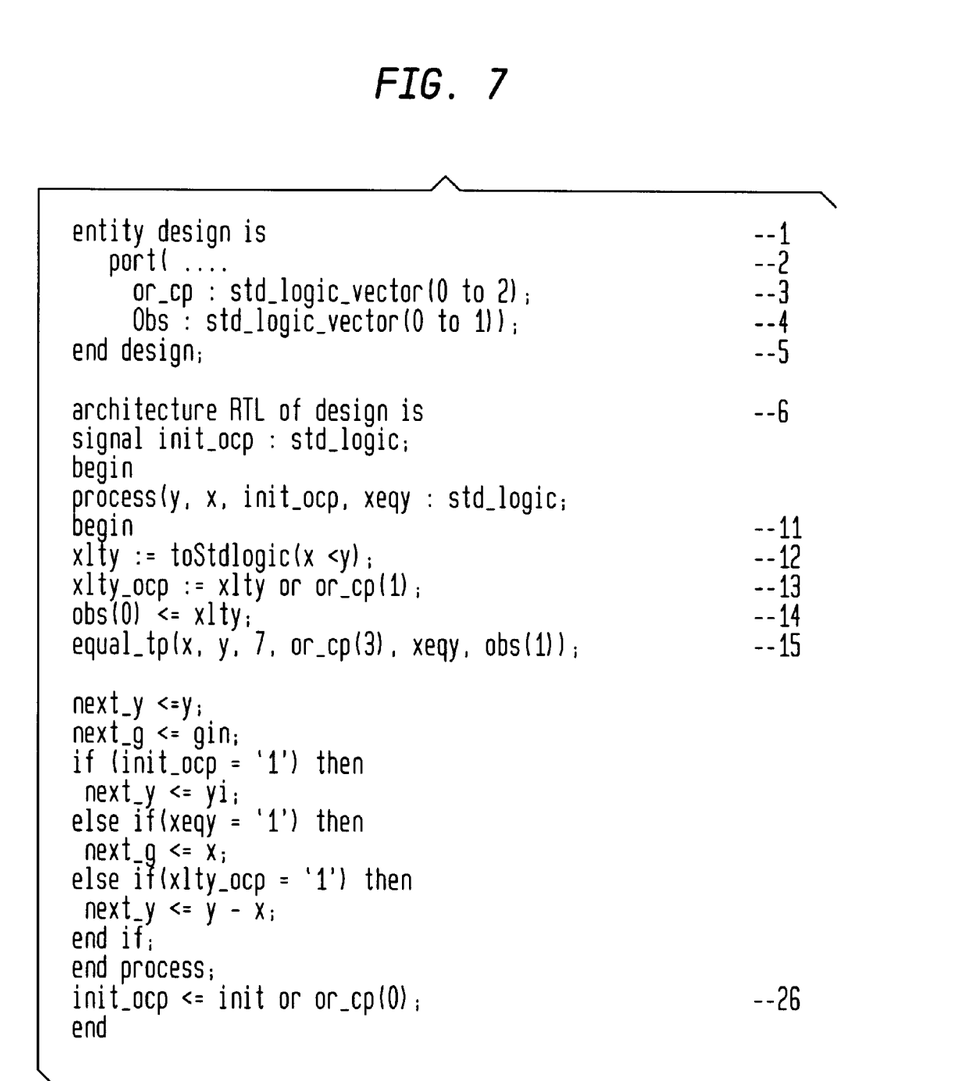
FIG. 7 illustrates a VHDL construct including test points, based on the VHDL construct of FIG. 3.

Once the Testability measures have been computed, the testpoints are inserted as described below. The general approach to test point insertion is to create a new signal/variable which is identical to the original signal under normal mode but has improved testability under BIST mode. For test point insertion at the RTL, there are two kinds of test points, node test points and operator test points. Described below with reference to FIG. 7 are examples of various kinds of test points, based on the VHDL construct described with reference to FIG. 3.

Node test points are the standard set of gate level test points shown in FIG. 1B applied to 1-bit data in the RTL Netlist model. 1-bit data may be, for example, a visible signal (init) or an intermediate node (xy3) which is the result of the expression (x<y). For visible signals such as init, a control point is added by using a concurrent assignment statement (e.g., line 26 of FIG. 7), where signal init_ocp, is identical to init under normal mode but has an improved controllability during BIST mode. All "reads" of the signal init are changed to "init_ocp". For intermediate nodes, the modifications are made in the process in which the expression corresponding to the node is being used. For example, an or-control point and an observe point are added to the intermediate node corresponding to (x<y) in lines 12–14 of FIG. 7. The variable xlty_ocp is modified with an or-control point. All references to the expression (x<y) are replaced by the computed value (xlty_ocp='1') resulting in higher controlability under the test mode.

Some RTL operators, such as "," and "=", have low fault coverages, even when their inputs are excited by perfectly random patterns and outputs have complete observability. In VHDL, these operator test points are defined by a VHDL procedure which is identical to normal operator function under normal mode, but has additional inputs/outputs which improve the testability of the operator under BIST mode. For example, the procedure call, "equal_tp(x, y, k, or_cp, xeqy, obs)" computes "x=y" in the output xeqy under normal mode (i.e., when or_cp="1"). Under BIST mode the value in xeqy is modified in a manner equivalent to inserting one or-control point and one observe point at the node $Eq_k$ of the structural model in FIG. 5. The valid values of k in the procedure "equal_tp" define all possible test points that can be inserted in the RTL operator "=". VHDL procedures for operator test points can be defined in a separate package which needs to be referenced in the source VHDL. For example, line 15 of FIG. 7 shows the operator test point "equal_tp" for k=7. The function(s) that result from the insertion of the test point (e.g., the insertion of an additional gate) will affect the gate level design and will, of course, have to be given consideration in any final circuit design.

Following is a description of an exemplary algorithm for selecting test points for a specific entity/architecture. In this example, an Algorithm "TP_select" selects a list of test points (max size tp-max) to reach a target fault coverage fmax.

1. Use algorithm "TestMeasures" to compute U=U_init.
2. Create a list of candidate test points tp_list. For all nodes in the RTL netlist model (rtl_mod), include or-control point if C(node)<0.5, otherwise use and-control point. Also try observe points if O(node)<0.5. Also include all operator test points for all operator instances.
3. For all test points in tp_list, insert the test point in the model (temporarily) and compute U. Choose the test point which results in maximum reduction of U from U_init and insert that permanently in rtl_mod.
4. Repeat step 3 until the fault coverage estimate with all the test points selected so far exceeds fmax or the number of test points exceed tpmax.

The test points selected by analyzing the RTL netlist model can then be inserted in the RTL-VHDL source in a conventional manner.

The method described and claimed enables the insertion of test points in a RTL VHDL design. These test points are effective at improving the fault coverage in full scan BIST environment and has lower area overhead than gate level BIST tools. Fault coverage estimation based on RTL VHDL is a good predictor of fault coverages that can be obtained after synthesis.

The above-described embodiments of the invention are intended to be illustrative only. Numerous other alternative embodiments may be devised by those skilled in the art without departing from the scope of the following claims. For example, despite the use of executable RTL operator models, the greedy approach used in the algorithm TestMeasures may take too much time for large RTL designs. A gradient-based approach may instead be adapted for use in RTL designs. Alternatively, an hierarchical approach may be used where sub-parts of a design are analyzed for test points separately. This may be particularly suitable for full scan BIST where test points affect the logic between flip-flops and thus affect only a part of the circuit.

In addition, the area overhead and fault coverage are likely to be sensitive to the degree of optimization. Different clock periods for synthesis could be utilized to determine the optimal overhead and fault coverage for particular application.

I claim:

1. A method for inserting a set of test points in an RTL VHDL design, comprising the steps of:
   converting an RTL source file to an RTL netlist model;
   computing a first cost function U of an estimated average test pattern length and a second cost function FC(l) of an estimated fault coverage for l patterns;
   selecting a test point in the RTL netlist model based on the values of U and FC(l); and
   inserting the selected test point into the RTL source file.

2. A method as set forth in claim 1, wherein said RTL netlist includes synthesizable operators, said computing step comprising the steps of:

defining a functional testability model for each synthesizable operator; and converting the defined functional testability models to controllability/observability equations.

3. A method as set forth in claim 2, wherein said selecting step comprises the steps of:

creating a list of candidate test points based on the controllability/observability equations; and computing from the list of candidate test points a test point which will achieve a maximum improvement in fault coverage.

4. A method as set forth in claim 3, wherein said step of creating a list of candidate test points comprises the steps of:

analyzing all nodes in the RTL netlist model;

adding an or-control point to the candidate list for all nodes having a controllability value less than 0.5; and adding an and-control point to the candidate list for all nodes having a controllability value greater than or equal to 0.5.

5. A method as set forth in claim 4, wherein said step of creating a list of candidate test points further comprises the step of:

adding an observation point to the candidate list for all nodes having an observability value of less than 0.5.

6. A method as set forth in claim 5, wherein said step of creating a list of candidate test points further comprises the step of:

adding an operator test point to the candidate list for all operators in the RTL netlist model.

7. A method as set forth in claim 6, wherein said inserting step comprises the steps of:

(a) temporarily inserting each test point in the candidate list into the RTL netlist;

(b) determining an initial cost function value $U_{INIT}$;

(c) computing the cost function U of each test point in the candidate list;

(d) comparing the cost function U of each test point in the candidate list with the initial cost function value $U_{INIT}$; and (e) permanently inserting in the RTL netlist a test point that results in the greatest reduction of cost function U from initial cost function value UINIT.

8. A method as set forth in claim 7, wherein said inserting step further comprises the step of repeating steps (a)–(e) until a predetermined fault coverage value is met.

9. A method for inserting a set of test points in an RTL VHDL design in which an RTL source file is synthesized into a gate-level description, comprising the steps of:

converting the RTL source file to an RTL netlist model which includes synthesizable operators;

defining a functional testability model for each synthesizable operator;

converting the defined functional testability models to controllability/observability equations;

creating a list of candidate test points based on the controllability/observability equations;

selecting from the list of candidate test points a set of test points which will achieve a target fault coverage; and inserting said set of test points in the RTL source file prior to synthesis into the gate-level description.

10. A method as set forth in claim 9, wherein said selecting step comprises the step of:

computing from the list of candidate test points a test point which will maximize fault coverage and adding said computed test point to said set of test points.

11. A method as set forth in claim 10, wherein said step of creating a list of candidate test points comprises the steps of:

analyzing all nodes in the RTL netlist model;

adding an or-control point to the candidate list for all nodes having a controllability value less than 0.5; and adding an and-control point to the candidate list for all nodes having a controllability value greater than or equal to 0.5.

12. A method as set forth in claim 11, wherein said step of creating a list of candidate test points further comprises the step of:

adding an observation point to the candidate list for all nodes having an observability value of less than 0.5.

13. A method as set forth in claim 12, wherein said step of creating a list of candidate test points further comprises the step of:

adding an operator test point to the candidate list for all operators in the RTL netlist model.

14. A method as set forth in claim 13, wherein said inserting step comprises the steps of:

(a) temporarily inserting one or more test points in the candidate list into the RTL netlist;

(b) determining an initial cost function value $U_{INIT}$;

(c) computing the cost function U of each test point in the candidate list;

(d) comparing the cost function U of each test point in the candidate list with the initial cost function value $U_{INIT}$; and (e) permanently inserting in the RTL netlist a one of said test points that results in the greatest reduction of cost function U from initial cost function value $U_{INIT}$.

15. A method as set forth in claim 14, wherein said inserting step further comprises the step of repeating steps (a)–(e) until a predetermined fault coverage value is met.

* * * * *